United States Patent [19]

Harju

[11] Patent Number: 5,294,919
[45] Date of Patent: Mar. 15, 1994

[54] PULSE GENERATION CIRCUIT FOR ROW SELECTION PULSES AND METHOD FOR GENERATING SAID PULSES

[75] Inventor: Terho Harju, Lohja, Finland
[73] Assignee: Planar International Oy, Espoo, Finland
[21] Appl. No.: 710,118
[22] Filed: Jun. 4, 1991
[30] Foreign Application Priority Data
  Jun. 4, 1990 [FI] Finland .................. 902755
[51] Int. Cl.$^5$ .................................. G09G 3/30
[52] U.S. Cl. .................................. 345/79; 345/76; 345/208; 315/169.3
[58] Field of Search .................. 340/781, 811, 805; 315/169.3

[56] References Cited

U.S. PATENT DOCUMENTS

4,594,589 6/1986 Ohba et al. .................. 340/781
4,707,692 11/1987 Higgins et al. .................. 340/781
4,733,228 3/1988 Flegal .................. 340/781

Primary Examiner—Tommy Chin
Assistant Examiner—A. Au
Attorney, Agent, or Firm—Jones, Day, Reavis & Pogue

[57] ABSTRACT

The present invention relates to a pulse generation circuit and drive scheme for row selection pulses in a symmetric control scheme of AC-excited thin-film electroluminescent (ACTFEL) displays. The circuit comprises a supply voltage source for feeding the circuit with the supply voltages, a circuit ground to establish the ground potential, two control inputs for controlling the pulse-generating circuit, an output for routing the row selection pulses to the display acting as the load, and an essentially symmetric circuit with respect to the circuit ground for generating the opposite-polarity row selection pulses.

12 Claims, 5 Drawing Sheets

PULSE GENERATION CIRCUIT FOR ROW SELECTION PULSES AND METHOD FOR GENERATING SAID PULSES

FIELD OF THE INVENTION

The present invention relates to a pulse generation circuit for a matrix display for row selection pulses.

The invention also concerns a method for generating said pulses.

The invention is applicable to the drive circuits of AC-excited thin-film electroluminescent (ACTFEL) displays. It is a particular object of the invention to achieve a novel circuit for generation of row selection pulses in conjunction with symmetric drive schemes.

BACKGROUND OF THE INVENTION

The display structure to be driven is characterized by
high capacitance of the display, typically of the order of 100 pF/mm$^2$;
a matrix structure comprised of row and column lines, and
sequential row-at-a-time writing in the selected rows, whereby the currently selected row is driven by a row selection pulse formed alternately from a positive or a negative DC voltage (Vwrp or Vwrn). Unselected rows are left floating. During the validity time of the row selection pulse, all column lines are simultaneously driven by column modulation pulses having their amplitudes in the range 0 ... Vm according to the desired luminance level of the addressed pixel on the selected row. The write sequence is continued by selecting the next row with a row selection pulse of opposite polarity to that employed on the preceding row, and then writing all pixels in the above manner. After all rows are written, that is, a full field has been written, the next field will be written in a similar fashion starting from the first row but now using row selection pulses of opposite polarity with respect to those of the preceding field.

For the sake of clarity, the following description elucidates the generation sequence of drive voltages for the on/off addressing of pixels on a display. If the row selection pulse has negative polarity, a column line to drive a pixel to the "ON" state receives the modulation voltage Vm, while a column line to drive a pixel to the "OFF" state is connected to the ground potential. For the next row driven by a positive-polarity row selection pulse, the column lines to drive a pixel to the "ON" state are correspondingly connected to the ground potential and the column lines to drive a pixel to the "OFF" state are raised to the modulation voltage Vm. Thus, for a row selection pulse of positive polarity, the "ON"-state pixel is excited by the voltage Vwrp and the "OFF"-state pixel by the voltage Vwrp−Vm. For a row selection pulse of negative polarity, these excitation voltages are Vm−Vwrn and Vwrn, respectively.

The current state of the art is illustrated in the following reference publications:

FI patent publication 62447 (ref. no. 1)
Japan Display 86, S. Harada, T. Ohba, Y. Kanatani, H. Uede (ref. no. 2)
Linear and Interface Circuit Applications 1986, Texas Instruments (ref. no. 3)
A Low-Power Drive Scheme for AC TFEL Displays, Marvin L. Higgins, SID 85 DIGEST (ref. no. 4)
Energy Recovery Sustain Circuit for the AC Plasma Display, Larry F. Weber and Mark B. Wood, SID 87 DIGEST (ref. no. 5).

Figure 1:
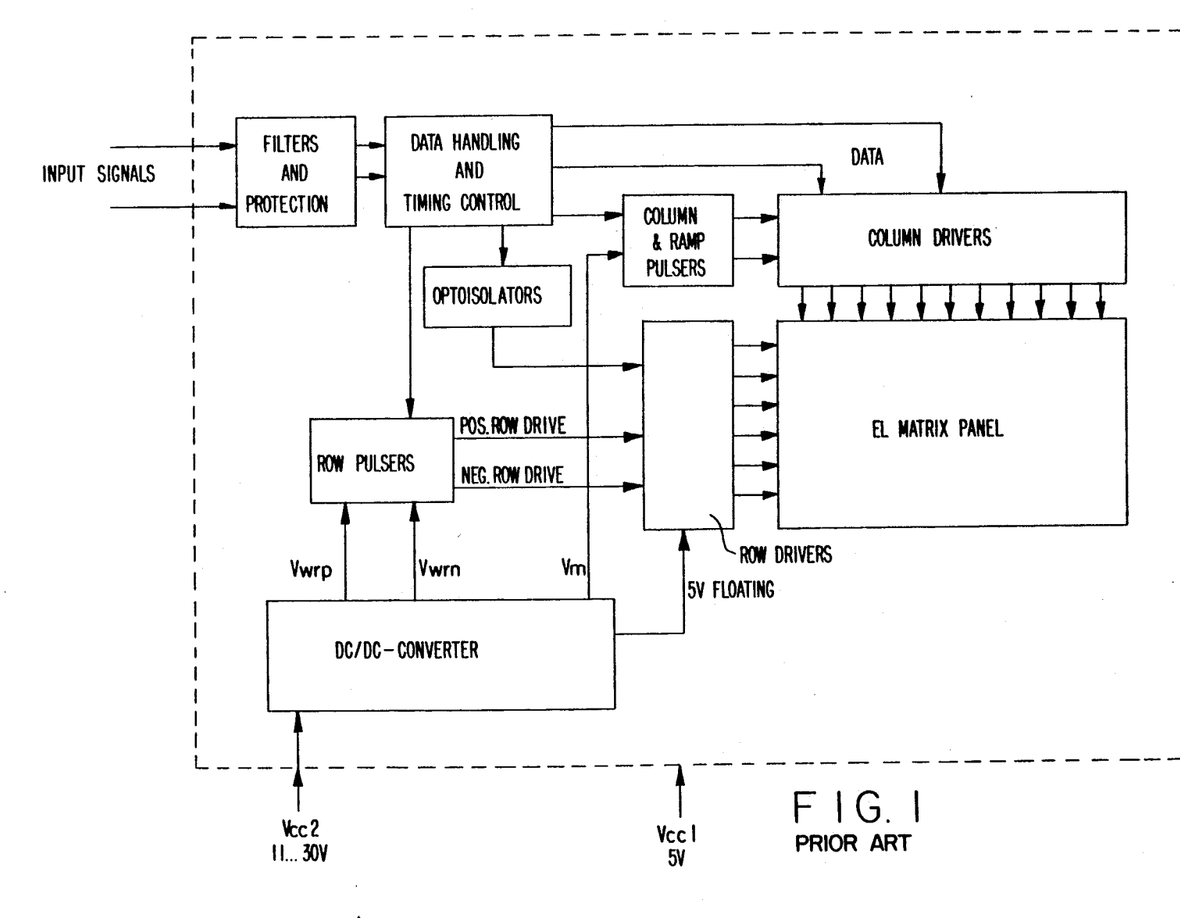
FIG. 1 shows a block diagram of the control electronics for a conventional ACTFEL matrix display, wherein the circuit implementation according to the invention concerns the block "Row pulsers" in the diagram.

The principles of symmetric drive schemes are to be found in, e.g., reference no. 1. A block diagram of the electronics circuits for a display is shown in FIG. 1.

For the symmetric drive scheme, circuits for row line pulsers are not conventionally known. It can be inferred, however, from the description and illustrations of the symmetric drive scheme disclosed in ref. no. 2 that the row pulser has here been implemented using a switch in which a series resistance is employed for limiting the voltage rate-of-rise during the rise phase of the row selection pulse. The discharging phase of the row selection pulse is evidently implemented with the help of a row driver circuit.

For the refresh drive scheme, row pulsers are generally implemented either using switches in which the voltage rate-of-rise and rate-of-fall are limited by a series resistance (ref. no. 3) or by means of constant-current switches (ref. no. 4).

When generating a pulse to a capacitive load, power consumption can be reduced by using an inductor in the pulser circuit. In circuits disclosed in the art, an inductor has been employed in the column pulser (ref. no. 4) and in the sustain pulser of a plasma display (ref. no. 5), but not in row pulsers.

Disclosed in ref. no. 4 is a resonant-type column pulser in which the inductor is connected in series with the load to be driven, complemented with four switches S1 ... S4 and four clamp diodes. Switch S1 is employed for charging the line load via the inductor, switch S2 serves for discharging the energy of the line load, and switch S3 routes the full amplitude sustain voltage from the supply voltage to the junction of the inductor and the load as well as aids to inhibit a possible backward oscillation. Switch S4 is placed from the junction of the inductor and the load to the ground so that it can activated to inhibit further oscillation after the discharging phase and to connect all columns to the ground potential for the duration of the refresh pulse. Both ends of the inductor are connected by diodes D1 ... D4 to the ground and the supply voltage so as to limit the oscillation between the supply voltage and the ground potential.

Disclosed in ref. no. 5 are the methods with which optimized timing of the switches can be utilized for improving the efficiency of the circuit configuration given in ref. no. 4 and simultaneously decreasing the peak value of the current pulse. In order to circumvent a complicated drive scheme of the switches, the authors of ref. no. 5 present an alternative circuit configuration which employs the commonly known characteristic of an LC circuit that the voltage over the capacitance in a series circuit of a capacitance and inductor rises to a two-fold value of the input step function amplitude. Thus, by complementing the drive circuit by a second supply voltage of half the required drive pulse amplitude and replacing switches S1 and S2 employed in the circuit of ref. no. 4 by unidirectional switches between the inductor and said extra voltage supply, the precise timing requirement of switch control signals is relaxed.

The prior-art techniques are hampered by several disadvantages.

In addition to the repetition rate of the row selection pulse, its duration is a factor that controls the luminance of the ACTFEL display. When the display matrix is large, comprising 400 pixel rows or more, the row selection pulse would become unnecessarily narrow in the drive concept according to ref. no. 2 due to the multiphase charging scheme; so the drive concept dealt with in the preambulatory part of this description and reference no. 1 is more appropriate for practical purposes. Herein, however, the use of a simple row pulser disclosed in ref. no. 2 is not possible, but instead, separate row pulser circuits must be employed for the positive and negative pulser, respectively.

Use of a resistive element for limiting the voltage rate-of-rise of the row selection pulse (ref. no. 3) is a poor solution in terms of the display luminance, because the pulse width is thereby narrowed, particularly above the luminance threshold voltage of the selected pixel. Here, as well as in the constant-current circuit of ref. no. 4, high power consumption is another disadvantage. The high power consumption results from higher line capacitance of the symmetric drive scheme with respect to that of refresh-type circuitry. The push-pull-type driver circuits required in the symmetric row drive scheme further contribute to the capacitive load by their own output capacitance.

Thus, the row pulser of the symmetric drive scheme is loaded by the combined capacitance of a single selected row and the capacitance of the row drive circuits. For instance, in a 480-row display the row line capacitance is 3.5 nF and the row driver circuits add 4.2 nF capacitance to this. Assuming a typical 180 V amplitude for the row selection pulse, power demand from the pulser without power recovery circuits would be $$480*(3.5 \text{ nF}+4.2 \text{ nF})*180^2 V^2*60 \text{ Hz}=7.2 \text{ W}.$$

Use of constant-current switches, for example, would impose a fourth of these power losses, that is, 1.8 W on a single switch, which in practice would exclude surface-mount switch component.

Implementations based on the use of a series inductance according to reference nos. 4 and 5 have two serious drawbacks.

Firstly, a functionally important drawback is that no practical circuit is devised for discharging the row line energy.

With the positive-voltage pulser there is a limitation that the row line cannot be discharged below the potential of unselected floating row lines down to ground potential without causing excessively high power losses. The reason is that, depending on the pixel data, the voltage of said floating row lines varies in the range 0 ... Vm, and this voltage would be dumped via the upper clamp diode of push-pull-type row driver circuits, thus bringing a significant increase to power losses, because in the worst case the entire panel capacitance would act as the load for the driver.

In the negative-voltage row pulsers as well, the implementation of the discharging phase is problematic. Use of a commercially available row driver circuit assumes that the unselected row lines are taken to the LOW state of the driver circuit for the duration of the positive-voltage row selection pulse. Resultingly, the negative-voltage row selection pulse output must be allowed to float in the voltage range 0 ... Vm during the positive-voltage row selection pulse in order to avoid undue increase in power consumption.

Another important drawback in the circuit implementations according to reference nos. 4 and 5 is their lack of protective measures for start and fault situations. When an optimized design for cost and packaging is desired, it is of primary importance that there is no need for overdimensioning the pulser switch elements for said situations.

Further handicaps on the way of developing the column driver concept disclosed in ref. no. 4 into a positive-voltage pulser circuit are set by poor efficiency as well as high peak current at the end of the charging and discharging phases of row line driving, which is detrimental to the life of the row electrode connector and limitation of EMI emissions.

An additional disadvantage hampering the applications of the sustain pulser according to ref. no. 5 is caused by its need for auxiliary supply voltages. The auxiliary voltage supplies can be replaced by mere capacitors, but this alternative dictates overdimensioning of switch elements for start situations, and in addition to the extra space consumption and cost of capacitors, brings along an abnormally steep pulse which sets stresses on the driver circuits and row electrode contacts at the start situation. Provided that these two serious drawbacks can be avoided, it is, however, possible to achieve easier integration of circuits, which in future applications may bring the nuisance of extra costs from the auxiliary power supplies to a tolerable level.

It is an object of the present invention to overcome the disadvantages of the prior-art technology and to achieve a novel circuit for generation of row selection pulses and a method for generating said pulses.

SUMMARY OF THE INVENTION

The present invention is based on the concept of dividing the generation of row selection pulses into two pulsers, of which one generates the positive-voltage row selection pulse and the other the negative-voltage row selection pulse. As used herein, a designation that has "N" or "n" associated therewith represents the negative-voltage row selection circuit and a comparable designation without the "N" or "n" represents the comparable positive-voltage row selection pulse generating circuit. The pulser load is fed via a series inductor L1, L1N. For charging the load capacitance via an inductor, there is placed a switch element S1, S2N between the inductor and the row pulser voltage supply Vwrp, Vwrn. Amplitude elevation to full value and sustain there is accomplished with a switch element S3, S3N placed between the supply voltage and the junction of the inductor and the load. The energy stored in the load capacitance is discharged via the inductor by means of a switch S2, S1N placed between the inductor and the ground. Additionally, in order to recover the energy stored in inductor L1 (L1N) during the charging and discharging phases and to limit the output voltage transients, diodes D1 ... D4 (D1N ... D4N) are connected from both sides of the inductor to the supply voltage Vwrp (Vwrn) and ground. The switches are advantageously controlled both with two external control signals PosWR1, PosWR2 (NegWR1, NegWR2) and auxiliary feedback circuits FB1 ... FB3 (FB1N ... FB3N) of each switch that are connected to the supply voltage and affect the turn-on phase to the ON state and the turn-off phase from the ON state.

More specifically, the circuit according to the invention is characterized by what is stated in the characterizing part of claim 1.

Furthermore, the method according to the invention is characterized by what is stated in the characterizing part of claim 4.

The invention provides outstanding benefits.

The circuit according to the invention achieves high efficiency, whereby circuit integration or use of small and inexpensive surface-mount components becomes possible. Due to dedicated feedback connections to each switch, reliability in starting and fault situations is improved over conventional circuits. Current output capability above pixel luminance threshold voltages is high, which is crucial for maintaining steady luminance. The number of switches required is small. In fact, the discharging phase of row selection pulses and DC level sustaining of floating rows against the column lines at zero voltage has been accomplished in all implementations without resorting to a fourth switch.

The number of external control inputs is also kept small, which decreases control circuitry costs and simplifies control. Employment of an inhibit input PosWR2 (NegWR2) for time-out of the activation time of switch S1 (S2N) ensures that the switch current cannot increase excessively during fault situations.

Control of switches via the source terminal of the switch element with the help of a bipolar transistor speeds the switching transition, which is essential to the cutting of energy consumption and power dissipation at the switches. Another advantage is easier control through use of bipolar transistors.

Employment of bootstrap switches as switch elements S1 and S3 of the positive-voltage row pulser facilitates use of cheaper and more readily available N-FET switches.

Implementation of the feedback loop through voltage sensing over switch (S3, S3N) ensures switch protection independently of the supply voltage level.

BRIEF DESCRIPTION OF THE DRAWINGS

The invention is next examined in detail with the help of the attached diagrams in FIGS. 1 ... 7.

DETAILED DESCRIPTION OF THE DRAWINGS

The subsequent text utilizes the following symbols designating the different circuit components:
D = diode,
L = inductor,
T = transistor,
ZD = zener diode,
R = resistor,
S = switch, and
C = capacitor.

Each letter symbol is complemented with an incremented numeric code that helps identifying the component in the diagram.

In practice, the generation of row selection pulses for an ACTFEL display is accomplished by dividing the task to two pulsers: the positive-voltage row pulser and the negative-voltage row pulser. This scheme both facilitates the feed of the brightness modulation pulse to the columns simultaneously with the row pulse drive and obviates the need for isolating the high-frequency control signals of the column drive circuits from the system ground.

To achieve lower power dissipation at the switches and to reduce total power consumption, the circuitry according to the invention is based on the utilization of the conventional LC resonant circuit concept formed by an inductor in series with a capacitive load.

Figure 2:
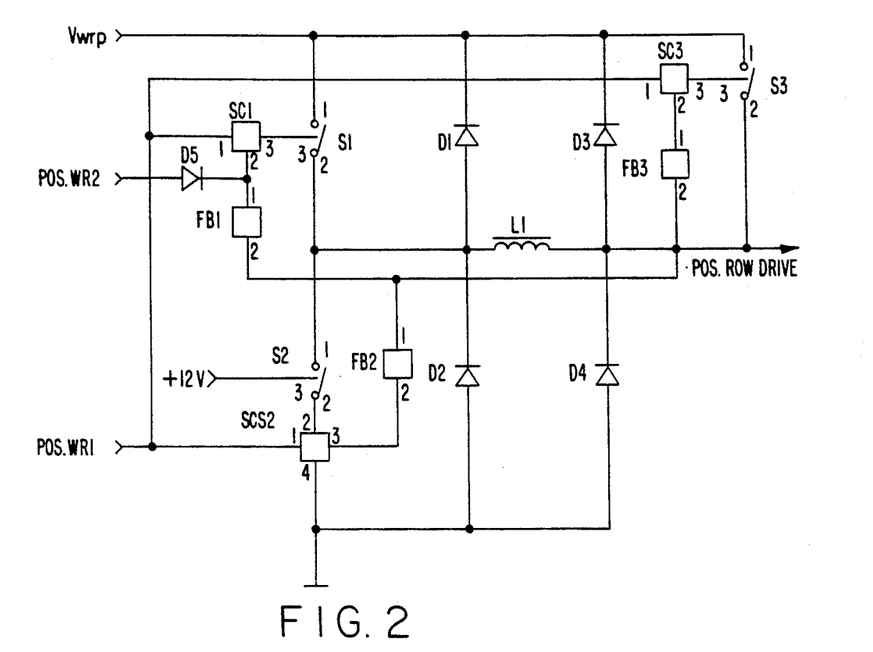
FIG. 2 shows diagrammatically a pulser circuit according to the invention for generation of the positive-voltage row selection pulse.
Figure 3:
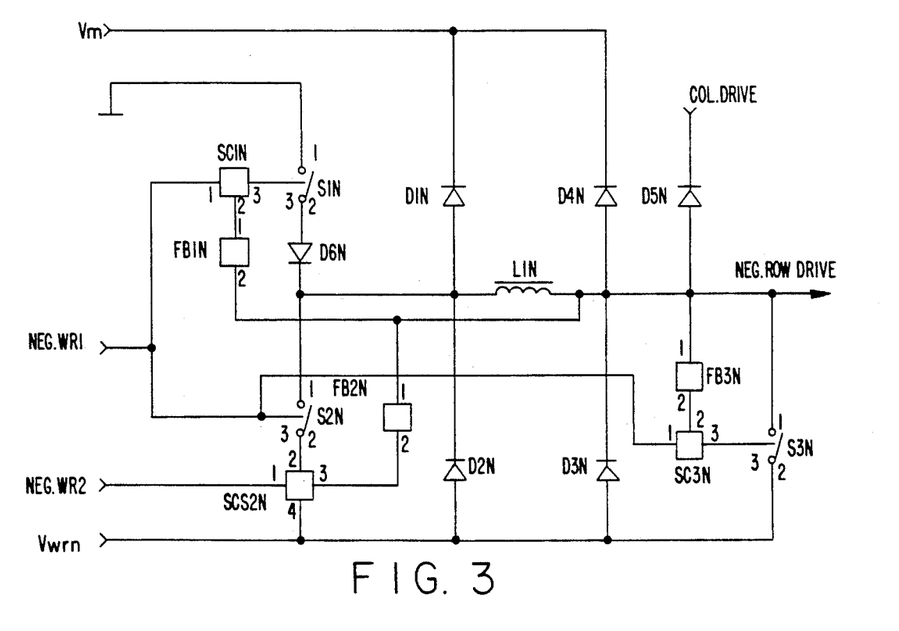
FIG. 3 shows diagrammatically a compatible pulser circuit according to the invention for generation of the negative-voltage row selection pulses, respectively.

As is evident from FIG. 2 and FIG. 3, the pulser circuit employs clamp diodes D1 ... D4 and D1N ... D4N respectively connected from both sides of inductor to the ground potential and the power supply lines in both row pulser types. Each switch element S1 ... S3 (S1N ... S3N) is provided with an individual feedback loop from the output voltage of the pulser that affects both the turn-on phase to and turn-off phase from the ON state.

To provide a path for charging the load capacitance, the circuit shown FIG. 2 employs a switch S1 placed between the supply voltage Vwrp and the inductor L1. The external control input PosWR1 of the switch and the internal feedback circuit FB1 of the pulser are taken to a control circuit SC1 of the switch. The external inhibit input PosWR2 is summed via a diode D5 to the feedback input of SC1. The amplitude elevation of the row selection pulse voltage to full value and prevention of backward oscillation in the diagram of FIG. 2 are accomplished with a switch S3 placed between the load and the supply voltage Vwrp. The external control input PosWR1, as well as the feedback circuit FB3, are both connected to the control circuit SC3 of the switch S3. For the discharging phase, the circuit shown in FIG. 2 has a switch S2, together with a control switch SCS2 of said switch, in series from the inductor to the ground. Connected to the control switch SCS2 are also a feedback circuit FB2 and an external control input PosWR1. To ensure that the row selection pulse amplitude remains in all situations in the range between the ground potential and the voltage Vwrp, the circuit has a diode D3 connected from the load to the voltage Vwrp as well as a diode D4 connected from the load to ground. To transfer the energy stored in the inductor L1 to the load after the feedback circuit FB1 has turned OFF switch S1, a diode D2 has been added to the circuit from ground to the inductor. Respectively, to extend the discharging phase with the help of the energy stored in the inductor after the instant when feedback circuit FB2 has turned OFF switch S2, the circuit incorporates diode D1 from the inductor to the voltage Vwrp. Inductor L1 is advantageously matched to resonate with the load capacitance at the operating frequency. Typically, the operating frequency is 30 kHz for a 480-row display, which represents a typical load capacitance of approx. 7 nF, whereby the inductance of the inductor is appropriately approx. 2 mH (refer to FIG. 4). More generally, the inductance of inductor L1 is selected so that the oscillation cycle time Tres in the resonant circuit formed by the inductor and the load capacitance is advantageously 100...200% longer than the added duration of the time periods reserved for the row selection pulse rise and fall phases. The inductance can be computed from the following formula:

$$L = Tres^2 / (4 * PI^2 * C)$$

L is the inductance of the inductor and C the load capacitance in the diagram.

Figure 2B:
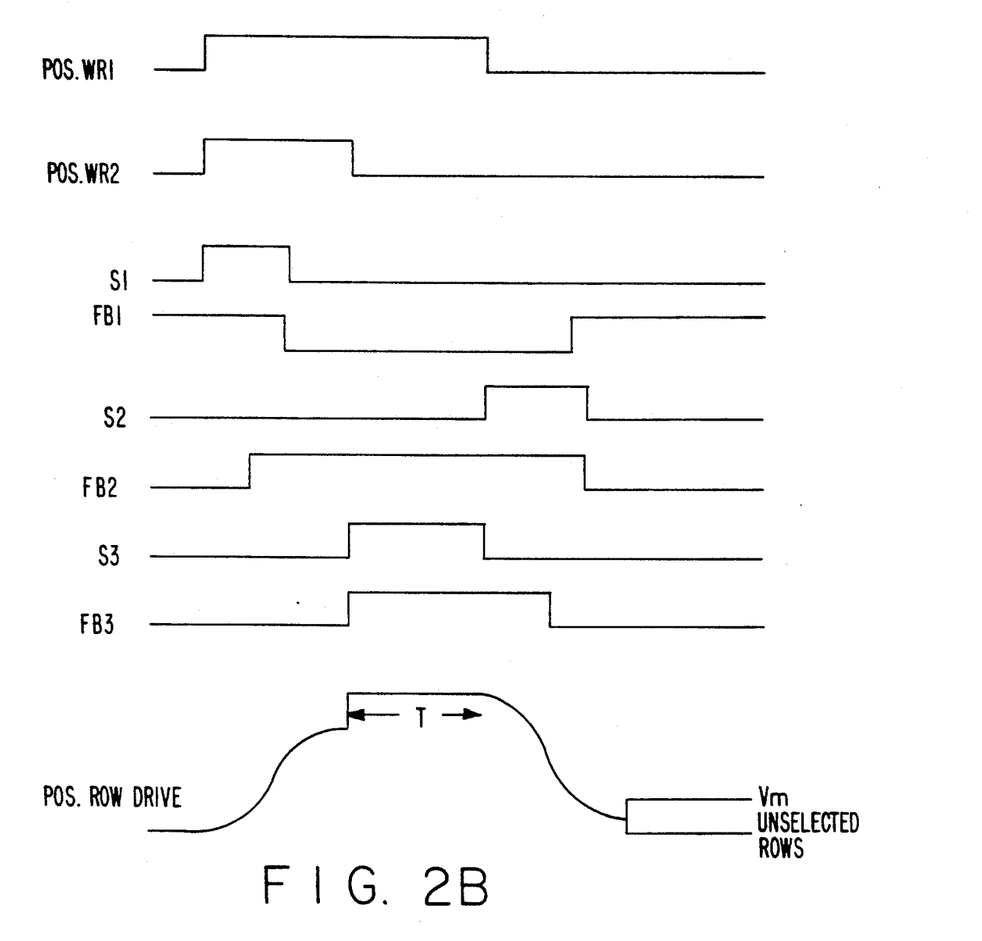
FIG. 2B shows the timing diagram associated with the functional description of the positive-voltage row pulser.

The circuit shown in FIG. 2 operates as follows: When the control input PosWR1 is set active (FIG. 2B), switch S1 is turned ON and current starts flowing from the voltage Vwrp via the inductor to the load capacitance. Simultaneously, switch S3 is enabled to turn ON as soon as feedback circuit FB3 has detected a sufficient voltage rise of the row selection pulse to at least half the amplitude of the row selection pulse. In normal operation, switch S1 is turned OFF under control of feedback circuit FB1 before switch S3 turns ON to feed the energy of inductor L1 to the load. In a fault situation, the voltage over the load does not increase sufficiently to activate feedback circuit FB1 to set OFF switch S1. In order to avoid excessive current increase in this situation, control signal PosWR2 turns OFF the switch after a preset timeout. At the end of the charging phase, switch S3 forces the row selection amplitude to full value, thus sustaining the voltage until the discharging phase starts. When control signal PosWR1 goes nonactive, switch S3 is turned OFF and switch S2 is turned ON. When the voltage over the load has dropped sufficiently, yet not below the maximum voltage Vm of the floating row lines, feedback circuit FB2 turns the switch S2 OFF and the energy stored in inductor L1 extends the discharging phase down to the voltage of the floating row lines. After this, the voltage of the row line falls together with the voltages of the other floating row lines to zero when the modulation voltage on the column driver side falls to zero.

Switch S1 (S2N) is turned ON at the start of the write cycle and turned OFF at the latest when the load voltage is the same with the supply voltage. Switch S2 (S1N) is turned ON using the common external with the switch S3 and turned OFF at the latest when the positive-voltage row pulser output voltage reaches the voltage of the floating unselected row lines, or correspondingly, the negative-voltage pulser output voltage is at the ground potential. Switch S3 (S3N) is turned ON not earlier than when the load voltage has reached half the supply voltage level. S3 is turned OFF after the lapse of the timeout period T. The length of T is approx. 60...70% of the entire cycle duration.

Control inputs of the switches are configured so that only two external control inputs PosWR1 and PosWR2 (NegWR1 and NegWR2) are required per pulser. Of these, when active, PosWR1 (NegWR1) turns ON switches S1 and S3 (S2N and S3N), provided that the switches are not inhibited by the feedback circuits. When PosWR1 (NegWR1) is nonactive, switch S2 (S1N) stays ON, provided that the switch is not inhibited by the feedback circuits. It is the duty of PosWR2 (NegWR2) to turn S1 (SN2) OFF from the "ON" state after the lapse have a preset time-out. Advantageously, switch S1 is a bootstrap-type switch.

Figure 4:
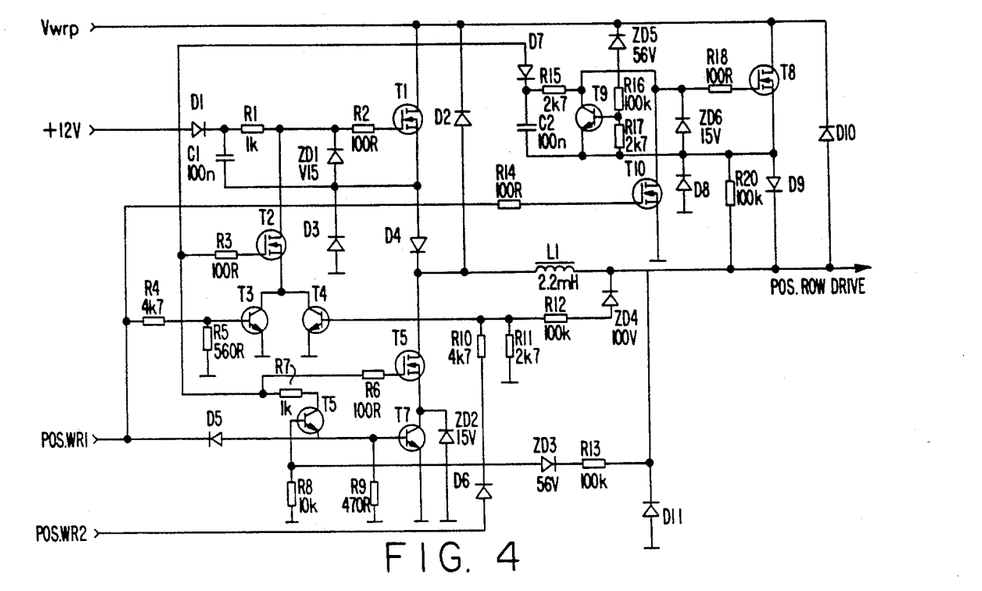
FIG. 4 shows an exemplifying circuit diagram of a positive-voltage row pulser according to the invention.

FIG. 4 illustrates the positive-voltage line pulser in a detailed example. The circuit components related to the different blocks in FIG. 2 are described in the following. Bootstrap-type switch S1 is comprised of T1, T2, D1, D3, D4, ZD1, C1, R1, R2 and R3. Control circuit SC1 is comprised of components T3, T4, R4, R5, R10, R11. Diode D5 in the diagram of FIG. 2 is replaced by diode D6 in FIG. 4. Feedback circuit FBI comprises a zener diode ZD4 and a resistor R12. Switch S2 comprises components T5 and R6. Control switch SCS2 comprises components T6, T7, D5, R7, R8, R9. Feedback circuit FB2 comprises components ZD3 and R13. Switch S3 is a bootstrap-type switch comprised of components T8, T10, D7, D8, D9, ZD6, C2, R14, R15 and R18. Control circuit SC3 of the switch comprises components T9 and R17. Feedback circuit FB3 proper comprises a zener diode ZD5 and a resistor R16. The circuit is complemented with a resistor R20 to ensure that the source voltage of T8 follows the load voltage. Diode D1 in FIG. 2 is replaced by diode D2 in FIG. 4; correspondingly, diode D2 is replaced by zener diode ZD2 functioning together with the body diode of T5, diode D3 is replaced by D10 and diode D4 by diode D11.

Feedback circuit FB1 of S1 comprises a zener diode ZD4 and a resistor R12. The source terminal of level-shift transistor T2 in switch S1 is taken to ground via transistor T4. Feedback circuit FB1 is connected from the load to the base of T4. The base of T4 is also fed from a second control input via diode D6, whereby the active state of control input turns OFF switch S1.

Feedback circuit FB2 of S2 is implemented as a series connection of a zener diode ZD3 and a resistor R13. Control to switch S2 is accomplished by a Darlington transistor T6, T7 connected between the source terminal of T5 and the ground. Feedback circuit FB2 is routed to the base of driver transistor T6.

Switch S3 is implemented with a bootstrap-type switch. Its feedback circuit is accomplished by sensing the drain-to-source of switch transistor T8 through a series connection of zener diode ZD5 and resistor R16 placed from the supply voltage Vwrp to base of T9 connected from the gate to the source of transistor T8.

The negative-voltage row pulser has preferably an operating principle and circuitry fully analogous to the positive-voltage pulser shown in FIG. 2. Merely the control of switch S1N which performs discharging of the energy from the load via the inductor needs to be modified so as to make the feedback circuit FB1N to turn and hold ON the switch for a preset time only. Switch S1N is again turned ON after a preset guard time, which ensures that the pulser output will not drift to a negative potential in stop situations due to, e.g., the internal currents of the pulser.

If the output stages of the unselected driver circuits are taken low during the positive-voltage row selection pulse, the clamp diodes are between Vm and Vwrn in the negative-voltage pulser. To prevent a consequential current reversal, an additional diode D6N is placed in series with switch S1N. Rise of DC voltage level at the negative-voltage pulser output is prevented by shortening the ON state duration at switch S1N, which is controlled by the feedback circuit.

The negative-voltage pulser shown in FIG. 3 has the basic circuit complemented with diodes D5N, D6N, while diodes D1N and D4N are taken to the supply voltage Vm of the column pulser, instead of ground. The reasons for these changes are as follows. Some types of commercial row driver circuits operate properly only if the outputs of unselected row driver circuits are taken low for the duration of the positive-voltage row selection pulse. Hereby, the row lines floating at the average modulation voltage are connected via the lower current-sinking FET element of the driver output stage to the output of the negative-voltage row pulser. In order to avoid power consumption increase, the output of the negative-voltage row pulser must be allowed to float in the range 0 . . . Vm during the positive-voltage row selection pulse. Therefore, diode D6N is necessary in series with switch S1N, while the clamp diodes D1N and D4N must be connected to the supply voltage Vm. Another problem is presented by the upwardly DC voltage drift tendency of the floating row lines, requiring prevention of the drift to avoid image burn-in on the display. The drift tendency is because with the fall of the positive-voltage row selection pulse, also the voltage at the output of the negative-voltage row pulser falls due to the capacitance of the row driver circuits. When switch S1N is ON holding one end of the inductor to the ground potential, current flow through the inductor commences and the energy is stored in the inductor. This energy is then transferred to the floating row lines, thereby elevating their voltage. Such a situation can be advantageously avoided by controlling the ON state of the discharging phase at switch S1N shorter than conventional so that only the next subsequent positive-voltage row selection pulse can elevate the output of the negative-voltage pulser up to the ground potential. Another method, costlier but easier to design, is to connect the output of the negative-voltage pulser via a diode D5N to the column pulser output.

Figure 5:
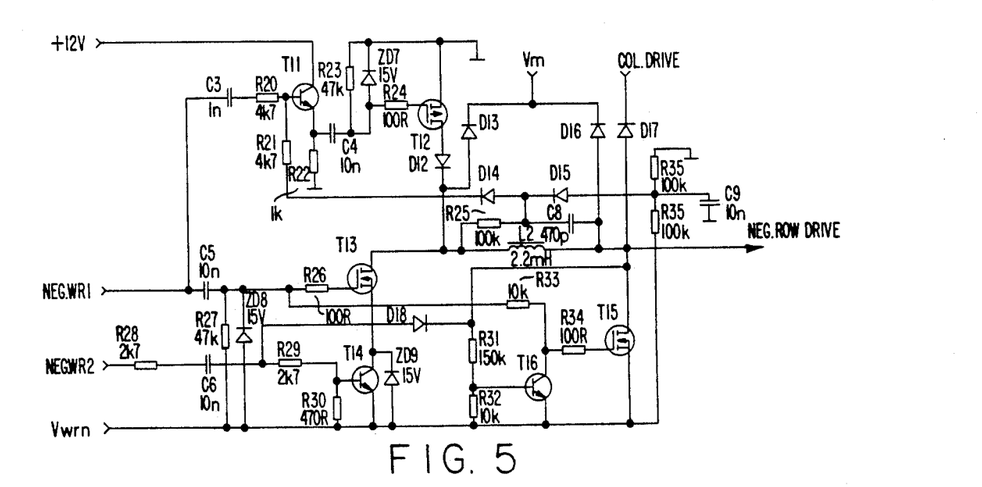
FIG. 5 shows an exemplifying circuit diagram of a negative-voltage row pulser according to the invention, respectively.

FIG. 5 shows an example of the implementation of the negative-voltage pulser. Blocks in the diagram of FIG. 3 are comprised as follows: Switch S1N includes components T12, ZD7, R23 and R24. Control circuit SC1 of the switch comprises components T11, C3, C4, R20, R21, R22. Feedback circuit FB1N comprises C8, D14, D15, R35, R36, C9. Diode D6N in the diagram discussed above is replaced by diode D12 in FIG. 5. Switch S2N is comprised of components T13, ZD8, C5, R26 and R27. Control circuit SCS2N of switch S2N comprises T14, C6, R28 . . . R30. Feedback circuit FB2N is formed by diode D18. Switch S3N comprises components T15, R34. Control circuit SC3N of the switch comprises R33 and T16, while feedback circuit FB3N is formed by resistors R31 and R32. Diode D1N in FIG. 3 is replaced by diode D13 in FIG. 5; correspondingly, diode D4N is replaced by diode D16. Diode D2N is formed by zener diode ZD9 functioning together with the body diode of T13. Diode D3N is provided by the body diode of transistor T15. Diode D5N in FIG. 3 is replaced by diode D17 in FIG. 5. Additionally, the circuit is complemented with R25 which, together with capacitor C8 belonging to the feedback circuit FB1N, forms the snubber circuit of inductor L2.

The feedback circuit of switch S2N is accomplished by diode D18 connected between the pulser output and the switch so that voltage dropping at the pulser output below the control voltage of switch S2N turns ON the switch. A driver transistor T14 is added to the source terminal of switch S2N.

Feedback circuit of switch S1N is accomplished by series connection of a diode D14 and capacitors C8 placed between the pulser output and control input of the switch so that switch S1N will be turned ON when the voltage difference between the ground and pulse output is equal to the voltage stored in capacitor C8. The capacitor included in the snubber circuit of inductor L2 can act as capacitor C8.

Feedback circuit of the switch S3N is accomplished by a resistive divider R31, R32 connected from the pulser output to the supply voltage Vwrn. The divider junction of the series connected resistors is connected to the base of a driver transistor T16, which is connected between the gate and source terminals of switch transistor T15.

The operation of circuit shown in FIG. 5 is as follows: When control signal NegWR1 goes high while control input NegWR2 is high, transistor T13 is turned ON, whereby the load capacitance starts charging towards the negative supply voltage Vwrn. High NegWR1 simultaneously also enables transistor T15 to turn ON as soon as the voltage over the load has dropped so low as to turn OFF driver transistor T16. When the voltage over the load has dropped down to the voltage Vwrn, diode D18 pulls base drive of transistor T14 down, whereby transistor T13 is turned OFF. At this phase, the energy stored in inductor L2 starts to return via the body diode of transistor T15 and diode D13 to the supply voltage lines Vm and Vwrn. If the voltage over the load in a fault situation does not drop sufficiently low, transistor T15 will not be turned ON, and transistor T13 stays turned ON until control signal NegWR2 goes low. When the pulser output voltage is low, feedback capacitor C8 will be charged to the voltage Vwrn/2. When control signal NegWR1 goes low, transistor T12 is turned ON, whereby the voltage over the load starts discharging to the ground potential via inductor L2. When the voltage over the load has risen to Vwrn/2, T11 is turned ON, which turns OFF T12. The discharge phase will be continued with the help of the energy stored in the inductor flowing via the body diode of transistor T13 and zener diode ZD9. When the pulser output voltage stops rising, transistor T12 is turned ON again. This arrangement ensures that the pulser output will not drift negative in halt situations due to the internal current paths of the pulser circuit.

Figure 6:
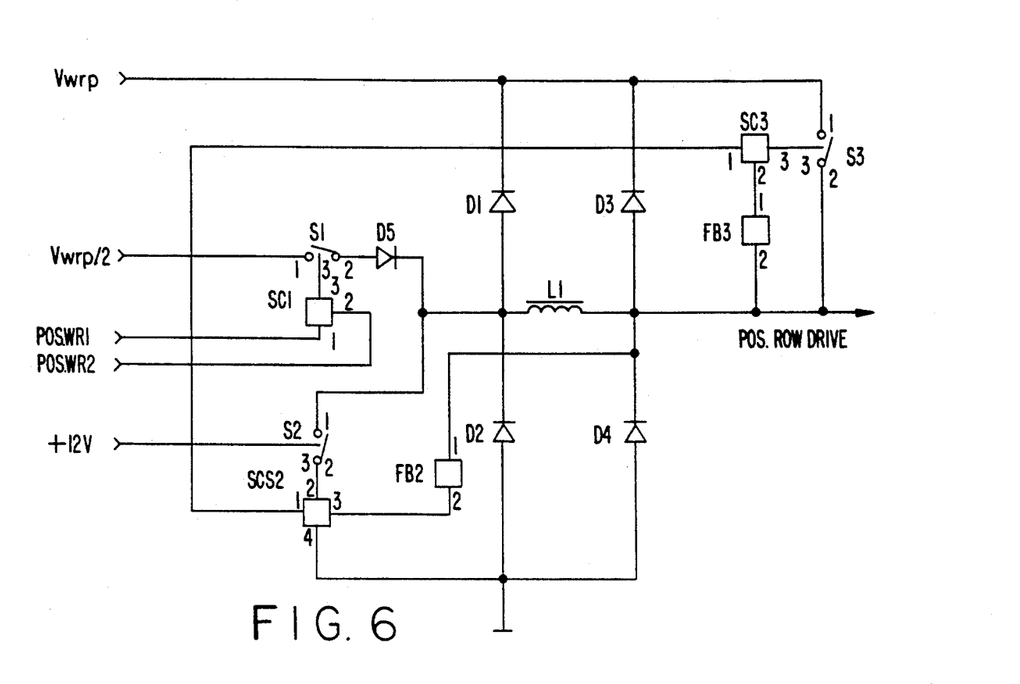
FIG. 6 shows diagrammatically an alternative implementation according to the invention for the positive-voltage row pulser.

FIG. 6 shows an alternative configuration for the positive-voltage row pulser. In this circuit, switch S1 of FIG. 2 is replaced by a new circuit utilizing an auxiliary supply voltage Vwrp/2, whose voltage is approximately half the voltage supplied by the main power supply of the actual operating voltage. Switch S1 and diode D5 are connected in series from this auxiliary power supply to the inductor to aid the charging phase. Due to the lower operating voltage, no feedback is required for switch S1. Switches S2 and S3 with their feedback circuits as well as diodes (D1 . . . D4) are connected in the same manner as in the basic circuit configuration. Switches S1, S2 and S3 have a single common external control input PosWR1, while switch S1 is additionally controlled by an inhibit input PosWR2. Alternatively, switch S1 can have a dedicated external control input, while switches S2 and S3 are controlled by a common control input. The negative pulser circuit can be implemented in an analogous manner.

Circuit shown in FIG. 6 functions as follows: When the external control input PosWR1 is activated, current starts flowing via the series connection formed by switch S1, diode D5 and the inductor from the auxiliary voltage Vwrp/2 to the load capacitance. Switch S3 is simultaneously enabled to turn ON as soon as the feedback circuit has detected a sufficient voltage rise over the load, at least above the voltage Vwrp/2. According to the conventionally known characteristic of an LC circuit, the energy stored in the inductor continues to increase the voltage over the load capacitance, in a zero-loss case up to a two-fold value with the respect to the step-function input voltage. In practice, due to losses, the attained voltage will remain slightly lower, so switch S3 is necessary to raise the pulser output voltage up to the voltage Vwrp. If the energy stored in the inductor in a fault situation is insufficient to raise the voltage over the load above Vwrp/2, switch S3 will not be enabled to turn ON. Switch S1 will be turned OFF when inhibit input PosWR2 is activated. During the discharge phase, the operation identical to that described for the basic circuit illustrated in FIG. 2.

Figure 7:
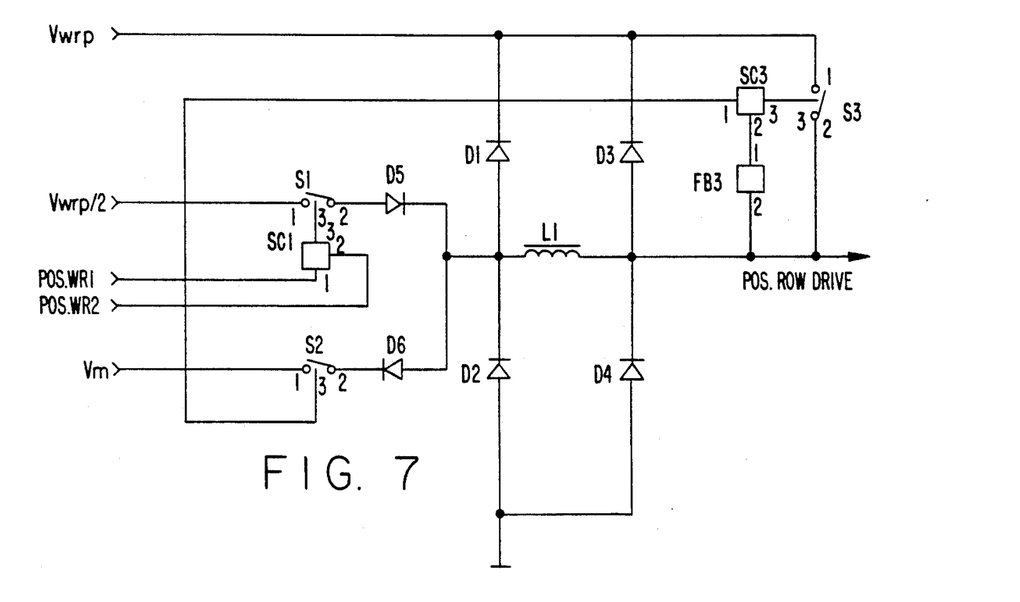
FIG. 7 shows diagrammatically a further alternative implementation according to the invention for the positive-voltage row pulser.

The circuit shown in FIG. 7 has discharge switch S2 of FIG. 6, together with its associated components, replaced by a series connection of switch S2 and diode D6 placed from the input terminal of the inductor to the modulation voltage Vm. This alteration brings about a slight simplification to the control of switch S2 because no feedback circuit will be needed. A disadvantage is an increase of power consumption at the voltage supply Vwrp, because the energy stored during the discharge phase in the inductor will be routed to the modulation voltage supply Vm, instead of the main supply voltage Vwrp.

If the unselected rows are taken down for the duration of the positive-voltage row selection pulse, the tendency of the DC voltage level to rise on the floating row lines can be alternatively prevented by connecting the negative-voltage pulser output via a diode D5N to the column line pulser output.

The bootstrap type switches can be replaced by P-FET switch elements and vice versa.

The control circuits of switches in each pulser circuit, that is, e.g., SC1, SCS2, SC3, can be replaced at least partially by a common control circuit, into which two external control signals PosWR1, PosWR2 and switch-controlling feedback signals FB1, FB2, FB3 are routed as inputs and from which at least two control signals are taken to the switches.

Control switches SCS2, SCS2N can be replaced by a circuit connected to the control input of main switch S2, S2N.

The feedback circuits associated with the switches shown in FIGS. 4 and 5 must be understood to represent exemplifying circuits, which can be used in conjunction with any switch other than that described in the example.

What is claimed is:

1. A pulse generation circuit for row selection pulses in a symmetric control scheme of an AC-excited thin-film electroluminescent display, the circuit comprising a supply voltage source for the circuit, a circuit ground to establish ground potential, first and second control inputs for controlling the circuit, an output for coupling the row selection pulses to the display as a capacitive load, and an essentially symmetric circuit with respect to the circuit ground, one-half of the symmetric circuit generating positive-voltage row selection pulses and the other half of the symmetric circuit generating negative-voltage row selection pulses; the circuit for generating the positive-voltage row selection pulses comprising:

a first inductor (L1) having an input terminal and an output terminal and being placed in series with the capacitive load, the first inductor (L1) being resonant with the load capacitance so that the cycle time of resonant oscillations is 100–200% longer than an added duration of time periods reserved for positive row selection pulse rise and fall phases:

a positive supply voltage source ($V_{wrp}$) having a voltage level;

a first switch (S1) having an input terminal and an output terminal, said first switch output terminal being connected to the input terminal of the first inductor (L1) and said input terminal of the first switch being coupled to the positive supply voltage source ($V_{wrp}$) for charging the load capacitance via the first inductor;

a second switch (S3) placed between the positive supply voltage source ($V_{wrp}$) and the output terminal of the first inductor (L1) for the purpose of elevating the amplitude of the positive row selection pulses to the voltage level of the positive supply voltage source ($V_{wrp}$) and preventing backward oscillation;

a third switch (S2) having first and second terminals and being coupled between the input terminal of the first inductor (L1) and ground potential for discharging energy stored in the load capacitance;

a first reverse biased clamp diode (D1) being connected from the input terminal of the first inductor (L1) to the positive supply voltage source ($V_{wrp}$), a second reverse biased clamp diode (D2) being connected from the input terminal of the first inductor (L1) to ground potential, a third reverse biased clamp diode (D3) being connected from the output terminal of the first inductor (L1) to the positive supply voltage source ($V_{wrp}$) and a fourth reverse biased clamp diode (D4) being connected from the output terminal of the first inductor (L1) to ground for recovering energy stored in the first inductor (L1) during the charging phase of the load and for limiting the output voltage; and a first feedback circuit (FB1) coupling the output terminal of the first inductor (L1) to the first switch (S1) for turning the first switch to an ON or an OFF state.

2. A circuit as in claim 1 wherein the circuit for generating the negative-voltage row selection pulses comprises:

a second inductor (L1N) placed in series with the capacitive load, the second inductor (L1N) having an input terminal and an output terminal and being resonant with the load capacitance so that the cycle time of resonant oscillations is 100–200% longer than an added duration of time periods reserved for the negative row selection pulse rise and fall phases:

a negative supply voltage source ($V_{wrn}$) having a voltage level;

a fourth switch (S2N) placed between the input terminal of the second inductor (L1N) and the negative supply voltage source ($V_{wrn}$) for charging the load capacitance via the second inductor (L1N);

a fifth switch (S3N) placed between the negative supply voltage source ($V_{wrn}$) and the output terminal of the second inductor (L1N) for the purpose of elevating the amplitude of the negative row selection pulses to the voltage level of the negative supply voltage source and prevent backward oscillation;

a sixth switch (S1N) coupling the input terminal of the second inductor (L1N) to ground potential, the sixth switch (S1N) serving for discharging energy stored in the load capacitance;

a modulation voltage power supply ($V_m$);

a first reverse biased clamp diode (D1N) being connected from the input terminal of the second inductor (L1N) to the modulation voltage power supply ($V_m$), a sixth reverse biased clamp diode (D2N) being connected from the input terminal of the second inductor (L1N) to the negative supply voltage source ($V_{wm}$), a seventh reverse biased clamp diode (D3N) being connected from the output terminal of the second inductor (L1N) to the negative supply voltage source ($V_{wm}$) and an eighth reverse biased clamp diode (D4N) being connected from the output terminal of the second inductor (L1N) to the modulation voltage power supply ($V_m$);

a discharging diode (D6N) coupling the input terminal of the second inductor (L1N) to the sixth switch (S1N) that performs the load discharging to the ground potential such that the negative-voltage row selection pulse circuit forming one-half of the symmetrical circuit can float during the generation of a valid positive-voltage row selection pulse from the other one-half of the symmetrical circuit in the range between the voltage supplied by the modulation voltage power supply ($V_m$) and the ground potential; and a second feedback circuit (FB1N) coupled from the output terminal of the second inductor (L1N) to the sixth switch (S1N) for turning the sixth switch (S1N) to an ON or an OFF state.

3. A circuit according to claim 2 further comprising at least one boot strap-type switch forming the first (S1), second (S3) or third switch (S2) of the positive-voltage row selection pulse circuit and the fourth (S2N), fifth (S3N) or sixth (S1N) switch of the negative-voltage row selection pulse circuit.

4. A circuit according to claim 2 further including a third feedback circuit (FB3) coupled to the second switch (S3) in the positive-voltage pulse generating circuit and a fourth feedback circuit (FB3B) coupled to the fifth switch (S3N) in the negative-voltage row selection pulse generating circuit, said third and fourth feedback circuits being configured so as to allow the corresponding positive-voltage row selection pulse generating circuit and the negative-voltage row selection pulse generating circuit to turn ON only when the load voltage rises above one-half the supply voltage.

5. A pulse generation circuit for row selection pulses in a symmetric control scheme of an AC-excited thin-film electroluminescent display, the circuit comprising a supply voltage source for the circuit, a circuit ground to establish ground potential, first and second control inputs for controlling the circuit, an output for coupling the row selection pulses to the display as a capacitive load, and an essentially symmetric circuit with respect to the circuit ground, one-half of the symmetric circuit generating positive-voltage row selection pulses and the other half of the symmetric circuit generating negative-voltage row selection pulses; the circuit for generating the positive-voltage row selection pulses comprising:

a first inductor (L1) having an input terminal and an output terminal placed in series with the capacitive load, the first inductor (L1) being resonant with the load capacitance so that the cycle time of resonant oscillations is 100–200% longer than an added duration of time periods reserved for positive row selection pulse rise and fall phases;

a positive supply voltage source ($V_{wrp}$) having a voltage level;

an auxiliary positive voltage supply ($V_{wrp}/2$) whose output voltage is approximately one-half of the positive supply voltage source ($V_{wrp}$);

a first switch (S1) having an input terminal and an output terminal and being placed between the first inductor (L1) and the auxiliary positive supply voltage source ($V_{wrp}/2$) for charging the load capacitance via the first inductor (L1);

a second switch (S3) placed between the positive supply voltage source ($V_{wrp}$) and the output terminal of the first inductor (L1) for the purpose of elevating the amplitude of the positive row selection pulses to the voltage level of the positive supply voltage source ($V_{wrp}$) and preventing backward oscillation;

a third switch (S2) coupled between the input terminal of the first inductor (L1) and ground potential for discharging energy stored in the load capacitance; and a first reverse biased clamp diode (D1) connected from the input terminal of the first inductor (L1) to the positive supply voltage source ($V_{wrp}$), a second reverse biased clamp diode (D2) being connected from the input terminal of the first inductor (L1) to ground, a third reverse biased clamp diode (D3) being connected from the output terminal of the first inductor (L1) to the positive supply voltage source ($V_{wrp}$) and a fourth reverse biased clamp diode (D4) being connected from the output terminal of the first inductor (L1) to ground for recovering energy stored in the first inductor during the charging phase of the load and for limiting the output voltage.

6. A pulse generation circuit for row selection pulses in a symmetric control scheme of an AC-excited thin-film electroluminescent display, the circuit comprising a supply voltage source for the circuit, a circuit ground to establish ground potential, first and second control inputs for controlling the circuit, an output for coupling the row selection pulses to the display as a capacitive load, and an essentially symmetric circuit with respect to the circuit ground, one-half of the symmetric circuit generating positive-voltage row selection pulses and the other half of the symmetric circuit generating negative-voltage row selection pulses; the circuit for generating the positive-voltage row selection pulses comprising:

a first inductor (L1) having an input terminal and an output terminal and being placed in series with the capacitive load, the first inductor (L1) being resonant with the load capacitance so that the cycle time of resonant oscillations is 100–200% longer than an added duration of time periods reserved for positive row selection pulse rise and fall phases;

a positive supply voltage source ($V_{wrp}$) having a voltage level;

a first switch (S1) having an input terminal and an output terminal;

an auxiliary positive voltage supply ($V_{wrp}/2$) whose output voltage is approximately one-half the output voltage of the positive supply voltage source ($V_{wrp}$);

a charging diode (D5) coupling the output terminal of the first switch (S1), which performs the charging of the load capacitance, to the input terminal of the first inductor (L1);

the input terminal of the first switch (S1) being coupled to the auxiliary positive voltage supply ($V_{wrp/2}$);

a second switch (S3) placed between the positive supply voltage source ($V_{wrp}$) and the output terminal of the first inductor (L1) for the purpose of elevating the amplitude of the positive row selection pulses to the voltage level of the positive supply voltage source ($V_{wrp}$) and preventing backward oscillation;

a modulation voltage power supply ($V_m$);

a third switch (S2) having first and second terminals and being coupled between the input terminal of the first inductor (L1) and the modulation voltage power supply ($V_m$) for discharging energy stored in the load capacitance; and a first reverse biased clamp diode (D1) being connected from the input terminal of the first inductor (L1) to the positive supply voltage source ($V_{wrp}$), a second reverse biased clamp diode (D2) being connected from the input terminal of the first inductor (L1) to ground potential, a third reverse biased clamp diode (D3) being connected from the output terminal of the first inductor (L1) to the positive supply voltage source ($V_{wrp}$) and a fourth reverse biased clamp diode (D4) being connected from the output terminal of the first inductor (L1) to ground for recovering energy stored in the first inductor (L1) during the charging phase of the load and for limiting the output voltage.

7. A circuit as in claim 6 further comprising:

a discharge diode (D6) being coupled between the first terminal of the third switch (S2) of the positive-voltage row pulse circuit which performs the discharging of the load capacitance and the input terminal of the first inductor; and the second terminal of the third switch (S2) being coupled to the modulation voltage supply ($V_m$).

8. A method of generating positive and negative row selection pulses in a circuit for symmetric control of an AC-excited thin-film electroluminescent display providing a capacitive load, the positive voltage row selection pulses being generated by a method comprising the steps of:

placing a first inductor (L1) having an input terminal and an output terminal in series with the capacitive load and matching the inductance of the first inductor to resonate with the load capacitance so that the cycle time of the resonant oscillations is 100-200% longer than an added duration of time periods reserved for row selection pulse rise and fall phases;

providing a positive supply voltage source ($V_{wrp}$) having a positive voltage level;

coupling the output terminal of a first switch (S1) to the input terminal of the first inductor (L1) and the input terminal of the first switch (S1) to the positive supply voltage source ($V_{wrp}$) to charge the load capacitance via the first inductor (L1);

placing a second switch (S3) between the positive supply voltage source ($V_{wrp}$) and the output terminal of the first inductor (L1) for elevating the amplitude of the positive row selection pulses to the voltage level of the positive supply voltage source ($V_{wrp}$) and preventing backward oscillation;

placing a third switch (S2) having input and output terminals between the input terminal of the first inductor (L1) and ground potential for discharging energy stored in the load capacitance;

recovering energy stored in the first inductor (L1) during the charging phase by extending the time for either or both charging and discharging of the capacitive load and by transferring the recovered stored energy to the positive supply voltage source ($V_{wrp}$) through the use of clamp diodes, a first clamp diode (D1) being connected from the input terminal of the first inductor (L1) to the positive supply voltage source ($V_{wrp}$), a second clamp diode (D2) being connected from the input terminal of the first inductor (L1) to ground potential, a third clamp diode (D3) being connected from the output terminal of the first inductor (L1) to the positive supply voltage source ($V_{wrp}$) and a fourth clamp diode (D4) being connected from the output terminal of the first inductor (L1) to the ground potential; and controlling the first switch (S1) by a feedback circuit (FB1) coupled between the output terminal of the first inductor (L1) and the first switch (S1) for turning the first switch (S1) to an ON or an OFF state.

9. A method according to claim 8 further comprising the steps of:

(a) turning the first switch (S1) ON and holding it ON until the capacitive load has a load voltage of at least one-half the positive supply voltage level ($V_{wrp}$) and then turning the first switch (S1) OFF;

(b) turning the second switch (S3) ON after the first switch (S1) is turned OFF;

(c) turning the second switch (S3) OFF and the third switch (S2) ON to initiate the discharging of the load capacitance; and (d) repeating steps (a), (b) and (c) for each subsequent row.

10. A method as in claim 8 wherein the method for generating negative row selection pulses in the circuit with symmetric control of an AC-excited thin-film electroluminescent display providing a capacitive load comprises the steps of:

generating a negative voltage level of a negative voltage power supply source ($V_{wm}$);

placing a second inductor (L1N) having an input terminal and an output terminal in series with the capacitive load for generating an output voltage to the capacitive load;

matching the inductance of the second inductor (L1N) with the load capacitance to cause the second inductor (L1N) to resonate with the load capacitance so that the cycle time of resonant oscillations is 100-200% longer than an added duration of time periods reserved for the row selection pulse rise and fall phases;

coupling a fourth switch (S2N) between the input terminal of the second inductor (L1N) and the negative supply voltage source ($V_{wrn}$) to charge the load capacitance;

placing a fifth switch (S3N) between the negative supply voltage source ($V_{wrn}$) and the output terminal of the second inductor (L1N) for elevating the amplitude of the negative row selection pulses to the voltage level of the negative supply voltage source ($V_{wrn}$) and prevent backward oscillation;

placing a sixth switch (S1N) between the input terminal of the second inductor (L1N) and ground potential for discharging energy stored in the load capacitance;

generating a modulation voltage ($V_m$); and recovering energy stored in the second inductor (L1N) during the charging phase by extending the time for either or both charging and discharging of the capacitive load and by transferring the recovered stored energy to the negative supply voltage source ($V_{wrn}$) through the use of clamp diodes, a first clamp diode (D2N) being connected from the input terminal of the second inductor (L1N) to the negative supply voltage source ($V_{wrn}$), a second clamp diode (D1N) connected from the input terminal of the second inductor (L1N) to the modulation voltage ($V_m$), a third clamp diode (D3N) connected from the output terminal of the second inductor (L1N) to the negative voltage supply source ($V_{wrn}$) and a fourth clamp diode (D4N) connected from the output terminal of the second inductor (L1N) to the modulation voltage ($V_m$).

11. In a method of generating positive and negative row selection pulses in a circuit for symmetric control of an AC-excited thin-film electroluminescent display providing a capacitive load, the positive voltage row selection pulses being generated by a method comprising the steps of:

placing a first inductor (L1) having an input terminal and an output terminal directly in series with the capacitive load and matching the inductance of the first inductor (L1) to resonate with the load capacitance so that the cycle time of the resonant oscillations is 100–200% longer than an added duration of time periods reserved for positive row selection pulse rise and fall phases;

providing a positive supply voltage source ($V_{wrp}$) having a positive voltage level;

providing an auxiliary positive voltage supply ($V_{wrp/2}$) whose output voltage is approximately one-half of the output voltage of the positive supply voltage source ($V_{wrp}$);

coupling the output terminal of a first switch (S1) to the input terminal of the first inductor (L1) and the input terminal of the first switch (S1) to the auxiliary positive supply voltage source ($V_{wrp/2}$) to charge the load capacitance via the first inductor (L1);

placing a second switch (S3) between the positive supply voltage source ($V_{wrp}$) and the output terminal of the first inductor (L1) for elevating the amplitude of the positive row selection pulses to the voltage level of the positive supply voltage source ($V_{wrp}$) and preventing backward oscillation;

placing a third switch (S2) having input and output terminals between the input terminal of the first inductor (L1) and ground potential for discharging energy stored in the load capacitance;

recovering energy stored in the first inductor (L1) during the charging phase by extending the time for either or both charging and discharging of the capacitive load and by transferring the recovered stored energy to the positive supply voltage source ($V_{wrp}$) through the use of clamp diodes, a first clamp diode (D1) being connected from the input terminal of the first inductor (L1) to the positive supply voltage source ($V_{wrp}$), a second diode (D2) being connected from the input terminal of the first inductor (L1) to ground, a third clamp diode (D3) being connected from the output terminal of the first inductor (L1) to the positive supply voltage source ($V_{wrp}$) and a fourth diode (D4) being connected from the output terminal of the first inductor (L1) to ground.

12. In a method of generating positive and negative row selection pulses in a circuit for symmetric control of an AC-excited thin-film electroluminescent display providing a capacitive load, the positive voltage row selection pulses being generated by a method comprising the steps of:

placing a first inductor (L1) having an input terminal and an output terminal in series with the capacitive load and matching the inductance of the first inductor (L1) to resonate with the load capacitance so that the cycle time of the resonant oscillations is 100–200% longer than an added duration of time periods reserved for positive row selection pulse rise and fall phases;

providing a positive supply voltage source ($V_{wrp}$) having a positive voltage level;

providing an auxiliary positive voltage supply ($V_{wrp/2}$) whose output voltage is approximately one-half of the output voltage of the positive supply voltage source ($V_{wrp}$);

coupling the output terminal of a first switch (S1) to the input terminal of the first inductor (L1) and the input terminal of the first switch (S1) to the auxiliary positive supply voltage source ($V_{wrp/2}$) to charge the load capacitance via the first inductor (L1);

placing a second switch (S3) between the positive supply voltage source ($V_{wrp}$) and the output terminal of the first inductor (L1) for elevating the amplitude of the positive row selection pulses to the voltage level of the positive supply voltage source ($V_{wrp}$) and preventing backward oscillation;

a modulation voltage power supply ($V_m$);

placing a third switch (S2) having input and output terminals between the input terminal of the first inductor (L1) and the modulation voltage power supply ($V_m$) for discharging energy stored in the load capacitance;

recovering energy stored in the first inductor (L1) during the charging phase by extending the time for either or both charging and discharging of the capacitive load and by transferring the recovered stored energy to the positive supply voltage source ($V_{wrp}$) through the use of clamp diodes, a first clamp diode (D1) being connected from the input terminal of the first inductor (L1) to the positive supply voltage source ($V_{wrp}$), a second diode (D2) being connected from the input terminal of the first inductor (L1) to ground, a third diode (D3) being connected from the output terminal of the first inductor (L1) to the positive supply voltage source ($V_{wrp}$) and a fourth diode (D4) being connected from the output terminal of the first inductor (L1) to ground.

* * * * *